(12) United States Patent
Park et al.

(10) Patent No.: US 10,950,684 B2
(45) Date of Patent: Mar. 16, 2021

(54) DISPLAY APPARATUS

(71) Applicant: Samsung Display Co., Ltd., Yongin-si (KR)

(72) Inventors: Jeongjin Park, Yongin-si (KR);
Seungsoo Ryu, Yongin-si (KR);
Euijeong Kang, Yongin-si (KR);
Sanghyuck Yoon, Yongin-si (KR);
Taeho Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/791,633

(22) Filed: Feb. 14, 2020

(65) Prior Publication Data

US 2021/0028271 A1    Jan. 28, 2021

(30) Foreign Application Priority Data

Jul. 22, 2019 (KR) .................. 10-2019-0088522

(51) Int. Cl.
*H01L 27/32* (2006.01)
*H01L 51/56* (2006.01)
*H01L 51/52* (2006.01)

(52) U.S. Cl.
CPC ...... *H01L 27/3279* (2013.01); *H01L 51/5246* (2013.01); *H01L 51/56* (2013.01); *H01L 2227/323* (2013.01)

(58) Field of Classification Search
CPC ............ H01L 51/5246; H01L 27/3253; G02F 1/134309; G02F 1/13458; G02F 1/13439; G02F 1/1345; G02F 1/13452
See application file for complete search history.

(56) References Cited

U.S. PATENT DOCUMENTS

| 9,632,381 | B2 | 4/2017 | Kang et al. |
| 10,170,462 | B2 | 1/2019 | Choi et al. |
| 10,180,607 | B2 | 1/2019 | Kong et al. |
| 2007/0182909 | A1* | 8/2007 | Kim .................. G02F 1/1362 349/149 |
| 2017/0082900 | A1* | 3/2017 | Kong .................. G02F 1/13452 |

FOREIGN PATENT DOCUMENTS

| JP | 2016-119413 | 6/2016 |
| KR | 10-2000-0021827 | 4/2000 |
| KR | 10-2014-0136238 | 11/2014 |
| KR | 10-2017-0005341 | 1/2017 |
| KR | 10-2017-0034078 | 3/2017 |
| KR | 10-2017-0080937 | 7/2017 |

* cited by examiner

*Primary Examiner* — Changhyun Yi
(74) *Attorney, Agent, or Firm* — Kile Park Reed & Houtteman PLLC

(57) ABSTRACT

A display apparatus includes a lower substrate including a display area including a display element and a non-display area around the display area; a sealing member disposed on the non-display area and around the display area; a terminal portion disposed on the non-display area and including at least one internal terminal extending toward an edge of the lower substrate; a fanout line portion connected to the at least one internal terminal and including a line extending to the display area; an upper substrate disposed to face the lower substrate and bonded to the lower substrate by the sealing member; and an upper groove portion on a side surface of the upper substrate to correspond to the at least one internal terminal.

20 Claims, 13 Drawing Sheets

DISPLAY APPARATUS

CROSS-REFERENCE TO RELATED APPLICATION

This application claims priority to and benefits of Korean Patent Application No. 10-2019-0088522 under 35 U.S.C. § 119, filed in the Korean Intellectual Property Office on Jul. 22, 2019, the entire contents of which are incorporated herein by reference.

BACKGROUND

1. Technical Field

One or more embodiments relate to a display apparatus, and more particularly, to a display apparatus capable of minimizing the area of a non-display area outside of a display area.

2. Description of Related Art

Demand for display apparatuses with variously desired features affording commensurate advantages is continuous. The field of display apparatuses has rapidly changed to thin, light and large-area flat panel display devices (FPDs), which have replaced bulky cathode ray tubes (CRTs). A flat panel display device may include a liquid crystal display (LCD), a plasma display panel (PDP), an organic light emitting display device (OLED), and an electrophoretic display device (EPD).

The display apparatus may include a display area for implementing an image and a non-display area for not implementing an image.

SUMMARY

One or more embodiments include a display apparatus capable of reducing the area of a non-display area.

According to one or more embodiments, a display apparatus may include a lower substrate including a display area including a display element and a non-display area around the display area; a sealing member disposed on the non-display area and around the display area; a terminal portion disposed on the non-display area and including at least one internal terminal extending toward an edge of the lower substrate; a fanout line portion connected to the at least one internal terminal and including a line extending to the display area; an upper substrate disposed to face the lower substrate and bonded to the lower substrate by the sealing member; and an upper groove portion on a side surface of the upper substrate to correspond to the at least one internal terminal.

An external terminal may be disposed in a first region defined by the upper groove portion, the sealing member, and the edge of the lower substrate.

The external terminal may be disposed around a portion of the at least one internal terminal.

The external terminal may be connected to side and upper surfaces of the at least one internal terminal.

The external terminal may extend on the side surface of the upper substrate in a thickness direction of the upper substrate and may be disposed on a side surface of the lower substrate.

The at least one internal terminal may include a first internal terminal and a second internal terminal and the upper groove portion may include a first groove and a second groove spaced apart from the first groove, wherein the first internal terminal may correspond to the first groove and the second internal terminal may correspond to the second groove.

The first internal terminal may be disposed in the first groove, and the second internal terminal may be disposed in the second groove.

The external terminal may include a first external terminal and a second external terminal spaced apart from the first external terminal, wherein the first external terminal may be disposed in the first groove and connected to the first internal terminal, and the second external terminal may be disposed in the second groove and connected to the second internal terminal.

The display apparatus may include a column support disposed between the terminal portion and the sealing member, and the external terminal may be disposed in a second region defined by the upper groove portion, the column support, and an edge of the lower substrate.

The display apparatus may include a lower groove portion on the side surface of the lower substrate to correspond to the at least one internal terminal.

The at least one terminal may be disposed in the lower groove portion.

The external terminal may be disposed in a third region defined by the upper groove portion, the lower groove portion, and the sealing member, and may be connected to the at least one internal terminal.

The display apparatus may include an additional terminal between the upper substrate and the at least one internal terminal, and the additional terminal may be disposed in a first region defined by the upper groove portion, the sealing member, and the edge of the lower substrate.

An external terminal may be disposed in the first region, and the external terminal may be connected to the additional terminal.

The side surface of the upper substrate and the side surface of the lower substrate may be flush with each other.

According to one or more embodiments, a display apparatus may include a lower substrate including a display area including a display element and a non-display area around the display area; a sealing member disposed on the non-display area and around the display area; a terminal portion disposed on the non-display area and including at least one internal terminal extending toward an edge of the lower substrate; a fanout line portion connected to the at least one internal terminal and including a line extending to the display area; an upper substrate disposed to face the lower substrate and bonded to the lower substrate by the sealing member; and an upper groove portion disposed at an edge where side and lower surfaces of the upper substrate meet; and external terminal disposed in the upper groove portion, wherein the upper groove portion corresponds to the at least one internal terminal, and the external terminal may extend toward and is connected to the at least one internal terminal.

The at least one internal terminal may be disposed in the upper groove portion and may be connected to the external terminal in the upper groove portion.

The external terminal may be connected to an upper surface of the at least one internal terminal.

The external terminal may extend in a thickness direction of the upper substrate and may be disposed on a side surface of the lower substrate.

The display apparatus may include a lower groove portion disposed at an edge where side and upper surfaces of the lower substrate meet, wherein the external terminal may extend in the thickness direction of the upper substrate and be disposed in the lower groove portion, and may be disposed around the at least one internal terminal.

The external terminal may be connected to a lower surface of the at least one internal terminal.

The display apparatus may include an additional terminal between the upper substrate and the at least one internal terminal, and the external terminal may be connected to the additional terminal.

The side surface of the upper substrate and the side surface of the lower substrate may be flush with each other.

BRIEF DESCRIPTION OF THE DRAWINGS

The above and other aspects, features, and advantages of embodiments of the disclosure will be more apparent from the following description when taken in conjunction with the accompanying drawings, in which.

DETAILED DESCRIPTION OF THE EMBODIMENTS

Figure 1A:
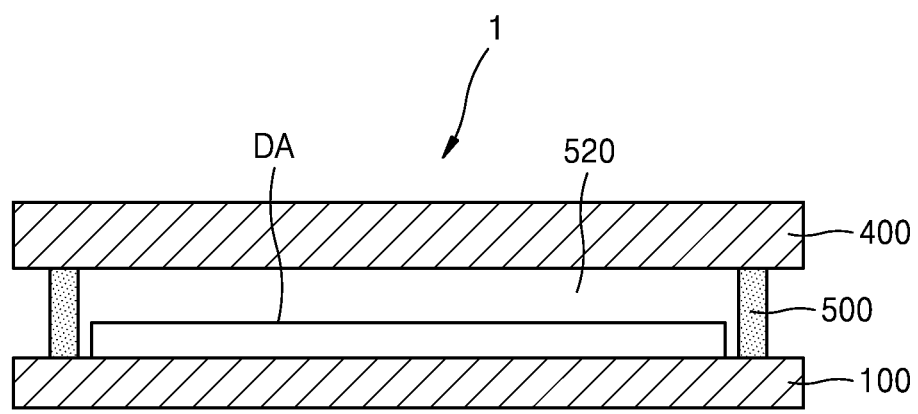
FIG. 1A shows a schematic cross-sectional view of a display apparatus according to an embodiment.

An effect and a characteristic of the disclosure, and a method of accomplishing these will be apparent when referring to embodiments described with reference to the drawings. The disclosure may, however, be embodied in many different forms and should not be construed as limited to the embodiments set forth herein.

Hereinafter, embodiments of the disclosure will be described in detail with reference to the accompanying drawings. The same reference numerals may be used to denote the same elements, and repeated descriptions thereof will be omitted.

It will be understood that although the terms "first", "second", etc. may be used herein to describe various elements, these elements should not be limited by these terms. For instance, a first element discussed below could be termed one of a second element, a third element, and a fourth element without departing from the teachings herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

An expression used in the singular encompasses the expression of the plural, unless it has a clearly different meaning in context. As used herein, the term "and/or" may include any and all combinations of one or more of the associated listed items. Expressions such as "at least one of," when preceding a list of elements, modify the entire list of elements and do not modify the individual elements of the list. As used herein, the term "and/or" may include any and all combinations of one or more of the associated listed items. Expressions such as "at least one of," when preceding a list of elements, modify the entire list of elements and do not modify the individual elements of the list.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. For example, intervening layers, regions, or elements may be present. In contrast, when an element is referred to as being "directly on" another element, there may be no intervening elements present. The word "over" or "on" means positioning on or below an object portion, and does not necessarily mean positioning on the upper side of the object portion based on a gravity direction.

Sizes of elements in the drawings may be exaggerated for convenience of explanation. In other words, since sizes and thicknesses of components in the drawings are arbitrarily illustrated for convenience of explanation, the following embodiments may not be limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is connected to another portion, the layer, region, or component may be directly connected to the portion or an intervening layer, region, or component may exist. For example, when a layer, region, or component is electrically connected to another portion, the layer, region, or component may be directly electrically connected to the portion or may be indirectly connected to the portion through another layer, region, or component.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

It will be understood that the terms "first," "second," etc. may be used herein to describe various components, these components should not be limited by these terms. These terms may only be used to distinguish one component from another.

As used herein, the singular forms "a," "an," and "the" are intended to include the plural forms as well, unless the context clearly indicates otherwise.

In the embodiments hereinafter, it will be understood that when an element, an area, or a layer is referred to as being connected to another element, area, or layer, it can be directly or indirectly connected to the other element, area, or layer. For example, it will be understood in this description that when an element, an area, or a layer is referred to as being in contact with or being electrically connected to another element, area, or layer, it may be directly or indirectly in contact with or electrically connected to the other element, area, or layer.

Further, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

Figure 1B:
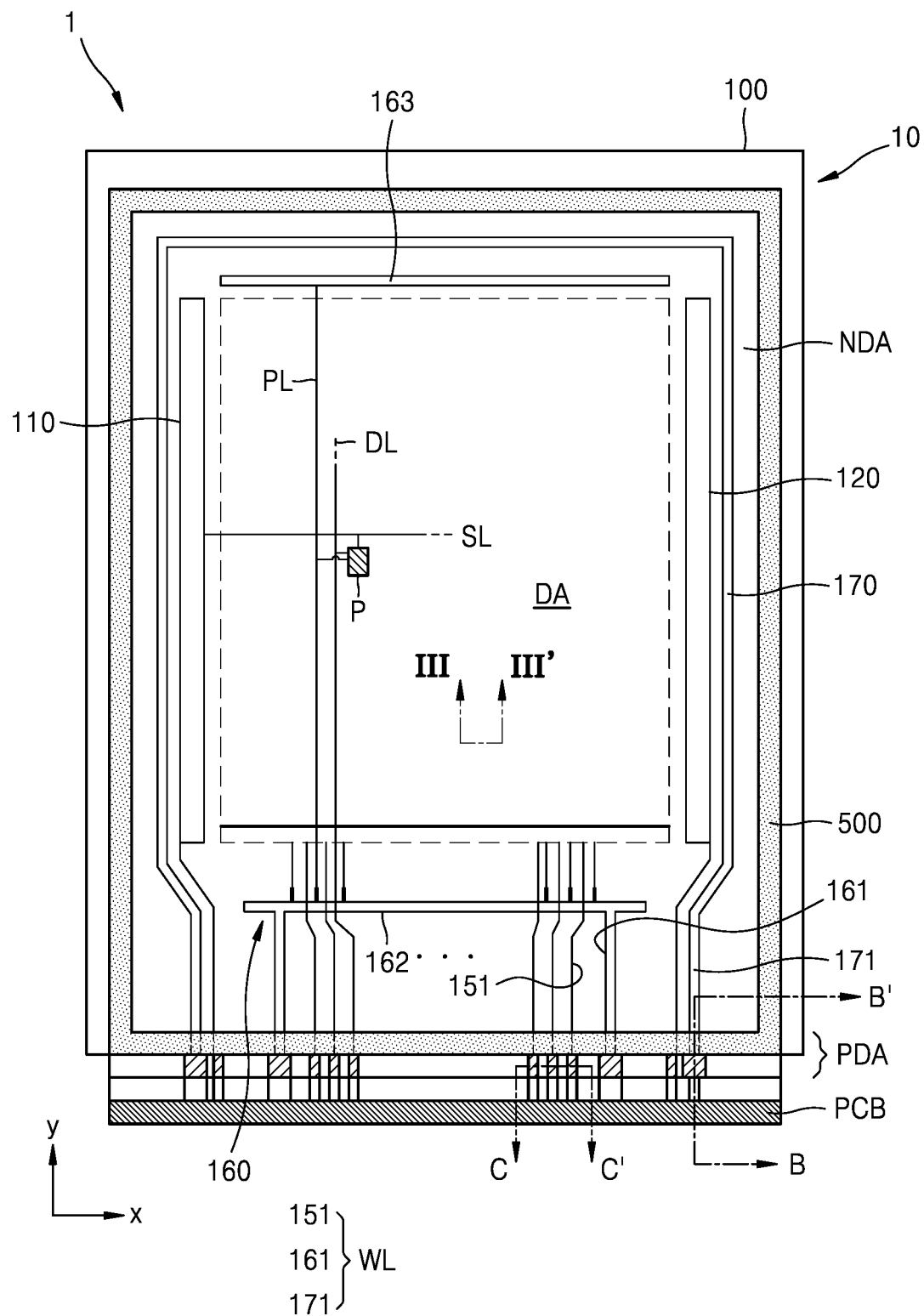
FIG. 1B shows a plan view of a display apparatus according to an embodiment.

FIG. 1A shows a schematic cross-sectional view of a display apparatus according to an embodiment. FIG. 1B shows a plan view of a display apparatus according to an embodiment.

Referring to FIG. 1A, the display apparatus 1 may include a display area DA on a lower substrate 100 and an upper substrate 400 sealing the display area DA. The display apparatus 1 may include a sealing member 500 for bonding the lower substrate 100 and the upper substrate 400.

The display apparatus 1 may be a liquid crystal display, an electrophoretic display, an organic light emitting display, an inorganic light emitting display, a quantum dot light emitting display, a field emission display, a surface-conduction electron-emitter display, a plasma display, a cathode ray display, and the like.

An organic light-emitting display may be provided as the display apparatus 1 according to an embodiment, but the display apparatus according to an embodiment may not be limited thereto, and thus various types of display apparatuses may be used.

The upper substrate 400 may be formed as a transparent member to implement an image from the display area DA and to prevent oxygen and moisture from penetrating into the display area DA. The upper substrate 400 may be a touch screen panel in which a touch screen panel may be formed to serve as a touch panel.

A polarizing film, a color filter, or a protective window (not shown) may be further provided on the upper substrate 400.

Edges of the lower substrate 100 and the upper substrate 400 may be coupled by the sealing member 500 to seal an inner space 520 between the lower substrate 100 and the upper substrate 400. The inner space 520 may be an absorbent or a filler. In other words, the inner space 520 may be defined by, so as to include, the absorbent or the filler.

The sealing member 500 may be disposed to surround or be around a periphery of the display area DA. The sealing member 500, which may form a portion sealing the lower substrate 100 and the upper substrate 400, may prevent oxygen, moisture, and the like from flowing into the display area DA, and may improve mechanical strength between the lower substrate 100 and the upper substrate 400 by bonding each thereof together.

In an embodiment, the sealing member 500 may be a sealant. In another embodiment, the sealing member 500 may include a material that is cured by a laser beam. For example, the sealing member 500 may be a frit. The sealing member 500 may include urethane resin, epoxy resin, acrylic resin, an inorganic sealant, or silicon, which may be an organic sealant. The urethane resin, for example, may include urethane acrylate. The acrylic resin, for example, may include butyl acrylate, or ethylhexyl acrylate. The sealing member 500 may include a material that may be cured by heat.

Referring to FIG. 1B, the display apparatus 1 may include the display area DA for implementing an image and a non-display area NDA for not implementing an image. The display apparatus 1 may provide an image using light emitted from pixels P in the display area DA.

The pixels P may be electrically connected to external circuits arranged in the non-display area NDA. The non-display area NDA may include a first scan driving circuit 110, a second scan driving circuit 120, a terminal portion PDA, a data driving circuit (not shown), a first power supply line 160, and a second power supply line 170.

The first scan driving circuit 110 may supply a scan signal to each pixel P through a scan line SL. The second scan driving circuit 120 may be disposed in parallel with the first scan driving circuit 110, with the display area DA therebetween. Some of the pixels P arranged in the display area DA may be electrically connected to the first scan driving circuit 110 and remaining pixels P may be connected to the second scan driving circuit 120. In another embodiment, the second scan driving circuit 120 may be omitted.

The terminal portion PDA may be on one side surface of the lower substrate 100. The terminal portion PDA may be on the non-display area NDA and may extend to an edge of the lower substrate 100. The terminal portion PDA may be outside of or beyond the sealing member 500. For example, in referring to FIG. 1B, the terminal portion PDA may be disposed to pass through the sealing member 500 so as to meet with the sealing member 500.

The terminal portion PDA may include a plurality of pads, and the plurality of pads may be spaced apart from each other.

The terminal portion PDA may be connected to a printed circuit board PCB. The pads of the terminal portion PDA may be exposed and electrically connected to the printed circuit board PCB.

An adhesive layer may be between the printed circuit board PCB and a display panel 10. The adhesive layer may be electrically connected to pads of the printed circuit board PCB and the terminal portion PDA. The printed circuit board PCB may transmit a signal or power of a controller (not shown) to the display panel 10. Control signals generated by the controller may be transmitted to the first and second scan driving circuits 110 and 120 through the printed circuit board PCB, respectively. The controller may provide first and second power supply voltages ELVDD and ELVSS to first and second power supply lines 160 and 170 through first and second connection lines 161 and 171, respectively. The first power supply voltage ELVDD may be provided to each pixel P through a driving voltage line PL connected to the first power supply line 160, and the second power supply voltage ELVSS may be provided to an opposite electrode of each pixel P connected to the second power supply line 170.

The data driving circuit may be electrically connected to a data line DL. A data signal of the data driving circuit may be provided to each pixel P through a connection line 151 connected to the terminal portion PDA and the data line DL connected to the connection line 151. In an embodiment, the data driving circuit may be on the printed circuit board PCB. In another embodiment, the data driving circuit may be on the lower substrate 100. For example, the data driving circuit may be between the terminal portion PDA and the first power supply line 160.

The first power supply line 160 may include a first sub-line 162 and a second sub-line 163 extending in parallel in an x direction, with the display area DA therebetween. The second power supply line 170 may partially surround or be around the display area DA in a loop shape, with one side thereof being open so as to not form a closed-loop.

The connection line 151, the first connection line 161, and the second connection line 171 may be defined as a fanout line portion WL including one of such connection lines extending to the display area DA. The fanout line portion WL may be connected to at least one pad of the terminal portion PDA.

Figure 1C:
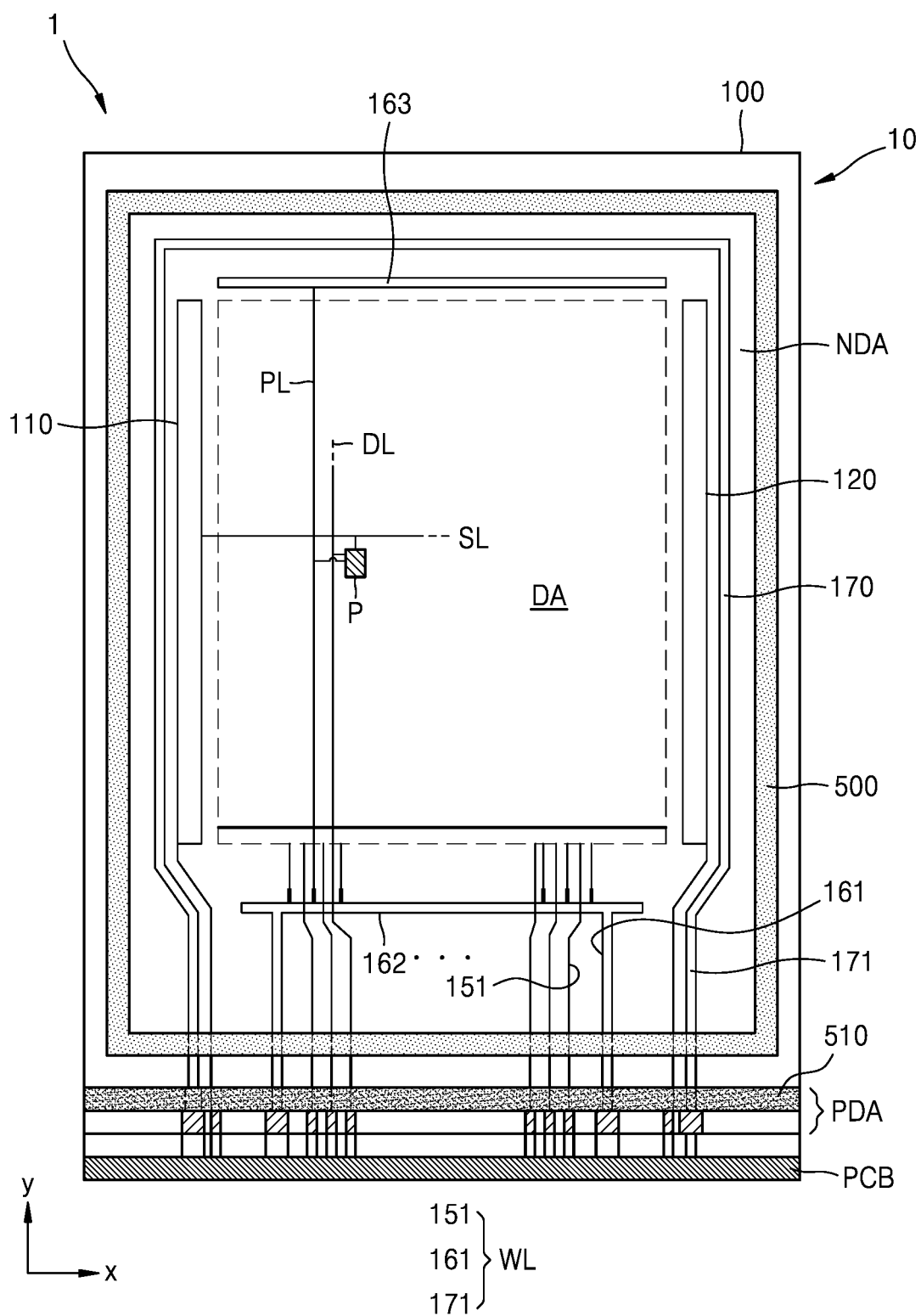
FIG. 1C shows a plan view of a display apparatus according to another embodiment.

FIG. 1C shows a plan view of a display apparatus according to another embodiment.

Referring to FIG. 1C, the display apparatus may further include a column space 510.

The column space 510 may be disposed to be spaced apart from the sealing member 500. The column space 510 may be outside or beyond the sealing member 500. The column space 510 may be a support portion for stably bonding the lower substrate 100 and the upper substrate 400 to each other. The column space 510 may protect the terminal portion PDA which may be disposed under the column space 510.

The column space 510 may include an organic insulating material such as polyimide, polyamide, acrylic resin, benzocyclobutene (BCB), hexamethyldisiloxane (HMDSO), and phenolic resin, and may be formed by spin coating.

The terminal portion PDA may be on one side surface of the lower substrate 100. The terminal portion PDA may be outside or beyond the column space 510. For example, pads of the terminal portion PDA may be arranged to pass through or meet the sealing member 500 and the column space 510 at the bottom of the display apparatus 1 to expose side surfaces of the pads of the terminal portion PDA.

Accordingly, the pads of the terminal portion PDA may be arranged on a lower surface of the column space 510 and may be connected to the printed circuit board PCB.

Figure 2:
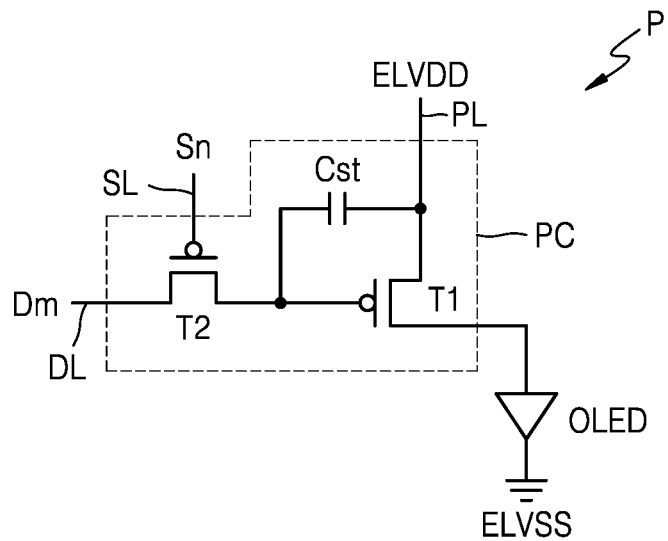
FIG. 2 shows a schematic diagram of an equivalent circuit of a pixel that may be included in a display apparatus according to an embodiment.

A discussion of a case in which the terminal portion PDA may be disposed to pass through or meet with the sealing member 500 at the bottom of the display apparatus 1 follows below with reference to FIG. 1B FIG. 2 shows a schematic diagram of an equivalent circuit of a pixel that may be included in a display apparatus according to an embodiment.

Referring to FIG. 2, each pixel P may include a pixel circuit PC connected to the scan line SL and the data line DL, and an organic light-emitting diode OLED connected to the pixel circuit PC.

The pixel circuit PC may include a driving thin-film transistor T1, a switching thin-film transistor T2, and a storage capacitor Cst. The switching thin-film transistor T2 may be connected to the scan line SL and the data line DL, and may supply a data signal Dm input through the data line DL according to a scan signal Sn to the driving thin-film transistor T1.

The storage capacitor Cst may be connected to the switching thin-film transistor T2 and the driving voltage line PL, and may store a voltage corresponding to a difference between a voltage supplied from the switching thin-film transistor T2 and the first power supply voltage ELVDD (or driving voltage) supplied to the driving voltage line PL.

The driving thin-film transistor T1 may be connected to the driving voltage line PL and the storage capacitor Cst, and may control a driving current that may flow to the organic light-emitting diode OLED from the driving voltage line PL corresponding to a voltage value stored in the storage capacitor Cst. The organic light-emitting diode OLED may emit light having certain luminance according to the driving current.

Although FIG. 2 shows a case where the pixel circuit PC may include two thin-film transistors and one storage capacitor Cst, the disclosure may not be limited thereto. For example, the pixel circuit PC may include seven thin-film transistors and one storage capacitor, and may be modified in various ways as may be understood by one of ordinary skill in the art.

Figure 3:
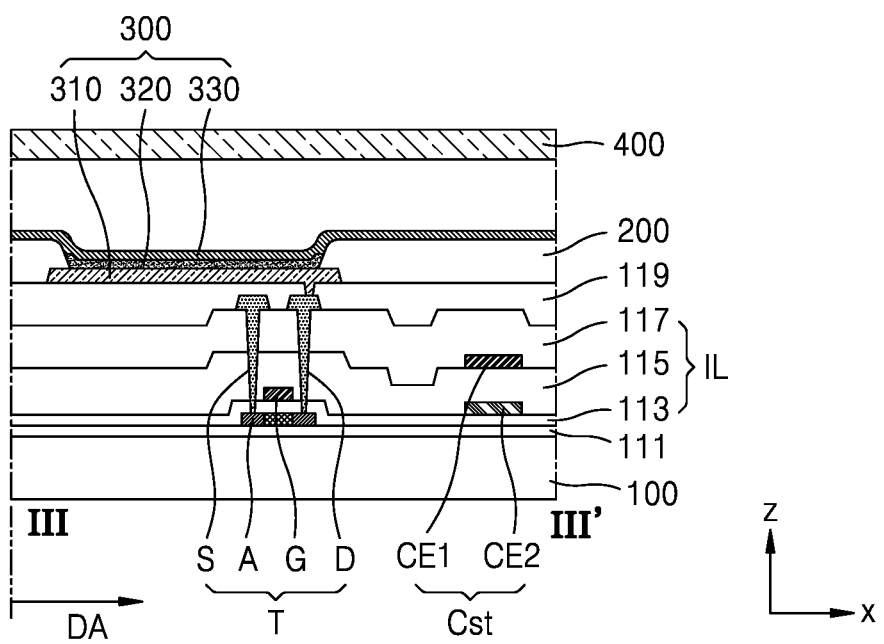
FIG. 3 shows a schematic cross-sectional view taken along line of FIG. 1B.

FIG. 3 shows a schematic cross-sectional view taken along line of FIG. 1B.

The display area DA of a display apparatus according to an embodiment may include a stacked structure configuration, as shown with reference to FIG. 3.

The lower substrate 100 may include glass or polymer resin. For example, the polymer resin may include polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). The lower substrate 100 including the polymer resin may be flexible, rollable, or bendable. The lower substrate 100 may have a multilayer structure including a layer including the above-described polymer resin and an inorganic layer (not shown).

A buffer layer 111 may be on the lower substrate 100 to reduce or block the penetration of foreign materials, moisture, or external air from a lower portions of the lower substrate 100, and may include a flat surface thereof disposed on the lower substrate 100. The buffer layer 111 may include an inorganic material, such as an oxide or nitride, an organic material, or an organic-inorganic composite material, and may have a single layer structure or a multilayer structure including an inorganic material or an organic material. A barrier layer (not shown) may be further interposed between the lower substrate 100 and the buffer layer 111 to block penetration of external air. The buffer layer 111 may include silicon oxide ($SiO_2$) or silicon nitride ($SiN_x$).

A thin-film transistor T may be on the buffer layer 111. The thin-film transistor T may include the semiconductor layer A, the gate electrode G, the source electrode S, and the drain electrode D.

FIG. 3 shows that the thin-film transistor T may include a top gate type. However, the embodiment may not be limited thereto and various types such as a bottom gate type may be adapted.

Although one thin-film transistor T is shown, the display apparatus may adopt two or more thin-film transistors T for one pixel.

The semiconductor layer A may include amorphous silicon or polycrystalline silicon. In another embodiment, the semiconductor layer A may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer A may include a channel region, and a source region and a drain region in a carrier concentration higher than that of the channel region.

The gate electrode G may be on the semiconductor layer A with a first gate insulating layer 113 therebetween. The gate electrode G may include molybdenum (Mo), aluminum (Al), copper (Cu), or Ti and may be formed as a single layer or multiple layers. For example, the gate electrode G may be a single layer of Mo.

The first gate insulating layer 113, which may insulate the semiconductor layer A from the gate electrode G, may include $SiO_2$, silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

A first electrode CE1 of the storage capacitor Cst may include the same material and be on the same layer as the gate electrode G1. A second electrode CE2 of the storage capacitor Cst may overlap or face the first electrode CE1, with the second gate insulating layer 115 therebetween.

In FIG. 3, the storage capacitor Cst may not overlap or face the thin-film transistor T. However, the disclosure may not be limited thereto. For example, the storage capacitor Cst may overlap or face the thin-film transistor T. The first electrode CE1 of the storage capacitor Cst may be integrally formed with the gate electrode G. In other words, the gate electrode G of the thin-film transistor T may function as the first electrode CE1 of the storage capacitor Cst.

An interlayer insulating layer 117 may be formed to cover the second electrode CE2. The interlayer insulating layer 117 may include $SiO_2$, $SiN_x$, SiON, $Al_2O_3$, $TiO_2$, $Ta_2O_5$, $HfO_2$, or $ZnO_2$.

The first gate insulating layer 113, the second gate insulating layer 115, and the interlayer insulating layer 117 may be collectively referred to as an inorganic insulating layer IL.

The source electrode S and the drain electrode D may be on the interlayer insulating layer 117. The source electrode S and the drain electrode D may include a conductive material including Mo, Al, Cu, Ti, or the like, and may be formed as a single layer or multiple layers including the above-described materials. For example, the source electrode S and the drain electrode D may have a multi-layered structure of Ti/Al/Ti.

A planarization layer 119 may be on the source electrode S and the drain electrode D, and an organic light-emitting diode 300 may be on the planarization layer 118. The planarization layer 119 may include organic materials and may be formed as a single layer or a multiple layers. The organic materials may include a general polymer such as polymethylmethacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. The planarization layer 119 may be a composite laminate of an inorganic insulating film and an organic insulating film.

Although FIG. 3 shows that the planarization layer 119 may be between the thin-film transistor T and the organic light-emitting diode 300, the disclosure may not be limited thereto. For example, a lower planarization layer and an upper planarization layer may be between the thin-film transistor T and the organic light-emitting diode 300, and various modifications may be possible.

In the display area DA of the lower substrate 100, the organic light-emitting diode 300 may be located on the planarization layer 119, the organic light-emitting diode 300 including a pixel electrode 310, an opposite electrode 330, and a light-emitting layer 320 interposed therebetween and including a light-emitting area. The pixel electrode 310 may be electrically connected to the thin-film transistor T through an opening formed in the planarization layer 119.

The pixel electrode 310 may be a reflective electrode. For example, the pixel electrode 310 may include a reflective film formed of Ag, Mg, Al, Pt, Pd, Au, Ni, Nd, Ir, Cr or a compound thereof, and a transparent or semi-transparent electrode layer formed on the reflective film. The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO).

A pixel-defining layer 200 may be on the planarization layer 119. The pixel defining layer 200 may define pixels by including an opening corresponding to each of sub pixels. For example, the opening may be an opening exposing at least a center of the pixel electrode 310. The pixel defining layer 200 may prevent generation of an arc on edges of the pixel electrode 310 by increasing a distance between the edges of the pixel electrode 310 and the opposite electrode 330 disposed above the pixel electrode 310. The pixel defining layer 200 may be formed of an organic material such as PI or HMDSO.

The light-emitting layer 320 of the organic light-emitting diode 300 may include a small-molecule or polymer material. In a case that the light-emitting layer 320 may include a small-molecule material, the light-emitting layer 320 may have a single or composite structure by stacking a hole injection layer (HIL), a hole transport layer (HTL), an emission layer (EML), an electron transport layer (ETL), and an electron injection layer (EIL). The light-emitting layer 320 may include various organic materials, such as copper phthalocyanine (CuPc), N,N-Di(naphthalene-1-yl)-N,N-diphenyl-benzidine (NPB), and tris-8-hydroxyquinoline aluminum (Alq3). The layers may be formed by an evaporation method.

In a case that the light-emitting layer 320 may include a polymer material, the light-emitting layer 320 may have a structure including an HTL and an EML. The HTL may include PEDOT and the light-emitting layer 320 may include a polymer material such as poly-phenylenevinylene (PPV) and polyfluorene. The light-emitting layer 320 may be formed by using a screen printing method, an ink jet printing method, or a laser induced thermal imaging (LITI) method.

The light-emitting layer 320 may not be limited thereto, and may have various other configurations. The light-emitting layer 320 may include an integral layer over the entire plurality of the pixel electrodes 310 or may have layers patterned to correspond to each of the pixel electrodes 310.

The opposite electrode 330 may be disposed over the display area DA to cover the display area DA as shown in FIG. 3. The opposite electrode 330 may be integrally formed with a plurality of organic light-emitting diodes to correspond to the plurality of the pixel electrodes 310.

The opposite electrode 330 may be a transparent electrode. The opposite electrode 330 may be a transparent electrode or a reflective electrode, and may include a metal thin-film, which has a small work function, including Li, Ca, lithium fluoride (LiF)/Ca, LiF/Al, Al, Ag, Mg or a compound thereof.

Since the pixel electrode 310 may be a reflective electrode and the opposite electrode 330 may be a light-transmitting electrode, the pixel electrode 310 may be a top-emission type in which light emitted from the light-emitting layer 320 may be irradiated to the opposite electrode 330. However, the pixel electrode 310 may be a bottom-emission type in which light emitted from the light-emitting layer 320 may be irradiated to the lower substrate 100. The pixel electrode 310 may include a transparent or semi-transparent electrode, and the opposite electrode 330 may include a reflection electrode. The display apparatus according to the embodiment may be a double-sided emission type emitting light toward the front and rear sides of the display apparatus.

The upper substrate 400 may be spaced apart from the opposite electrode 330. As described above, the upper substrate 400 may be formed as a transparent member to implement an image from the display area DA and to prevent oxygen and moisture from penetrating into the display area DA. The upper substrate 400 may be patterned with a touch pattern electrode to serve as a touch panel. A polarizing film, a color filter, or a protective window (not shown) may be further provided on the upper substrate 400.

Figure 4A:
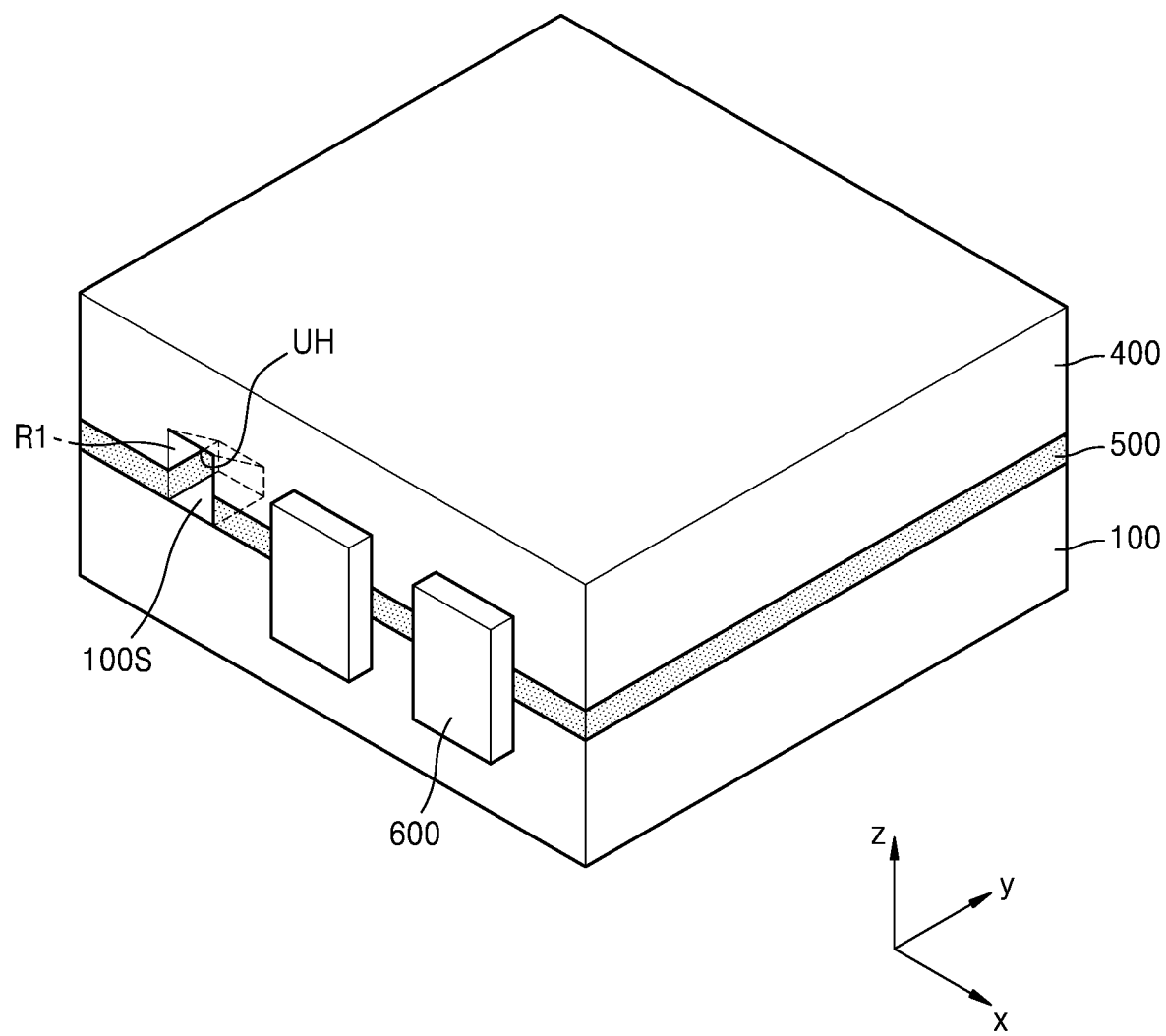
FIG. 4A shows a perspective view of a relationship between a lower substrate, an upper groove portion, and an upper substrate according to an embodiment.
Figure 4B:
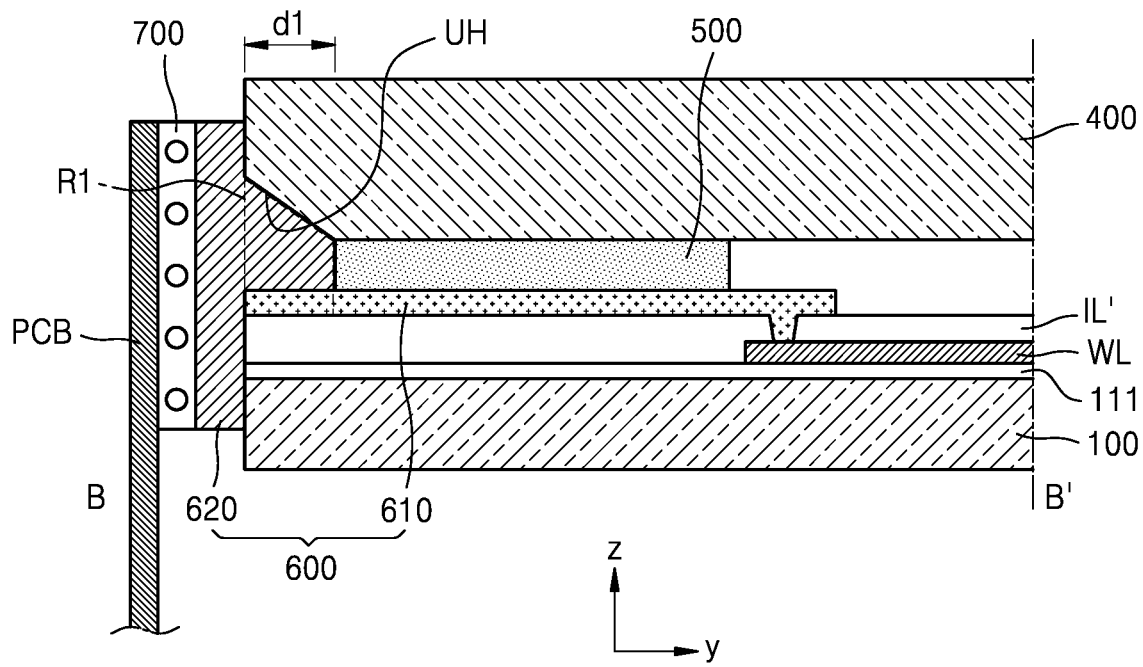
FIG. 4B shows a schematic cross-sectional view taken along line B-B' of FIG. 1B.
Figure 4C:
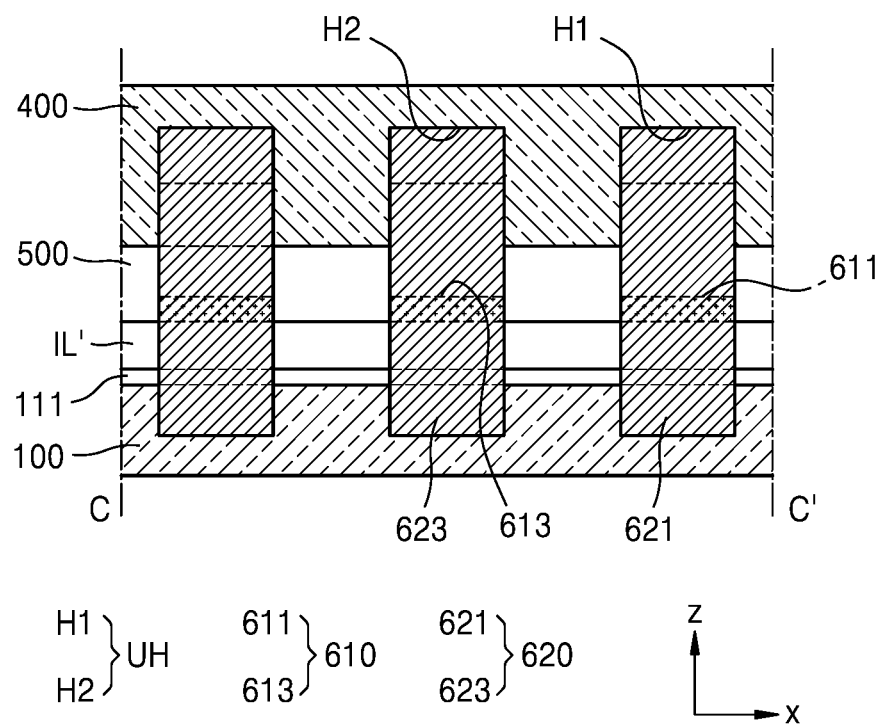
FIG. 4C shows a schematic cross-sectional view taken along line C-C' of FIG. 1B.

FIG. 4A shows a perspective view of a relationship between a lower substrate, an upper groove portion, and an upper substrate according to an embodiment. FIG. 4B shows a schematic cross-sectional view taken along line B-B' of FIG. 1B, and FIG. 4C shows a schematic cross-sectional view taken along line C-C' of FIG. 1B.

Referring to FIGS. 4A and 4B, a display apparatus according to an embodiment may include the lower substrate 100, the upper substrate 400, the sealing member 500, and a pad 600 disposed to partially overlap side surfaces of the lower substrate 100 and the upper substrate 400.

In FIG. 4A, the pad 600 may be omitted in one of upper groove portions to show a relationship with the lower substrate, an upper groove portion, and the upper substrate. A buffer layer and an inorganic insulating layer may also be omitted to assist in the showing of the aforementioned relationship.

The buffer layer 111 may be on the lower substrate 100, and the fanout line portion WL may be on the buffer layer 111. An inorganic insulating layer IL' may be on the fanout line portion WL. The inorganic insulating layer IL' may include at least one of the first gate insulating layer 113, the second gate insulating layer 115, and the interlayer insulating layer 117 of FIG. 3.

The pad 600 may be on the inorganic insulating layer IL', and the pad 600 may be connected to the fanout line portion WL through a contact hole formed in the inorganic insulating layer IL'. However, the disclosure may not be limited thereto. For example, the pad 600 may be on the same layer as the fanout line portion WL.

The terminal portion PDA may be on the non-display area NDA and may include at least one pad 600 extending to the edge of the lower substrate 100. In more detail, the pad 600 may extend toward an edge of the lower substrate 100 to expose one side of the pad 600. Accordingly, one side of the pad 600 may be exposed at the edge of the lower substrate 100, and another side of the pad 600 may be connected to the fanout line portion WL.

The sealing member 500 may be on the pad 600 to at least partially overlap or face the pad 600. Accordingly, the sealing member 500 may expose at least a portion of the pad 600. For example, the sealing member 500 may expose a portion of the pad 600 corresponding to the edge of the lower substrate 100. For example, the sealing member 500 may not be on a portion of the pad 600.

The upper substrate 400 may be on the sealing member 500, and an upper groove portion UH may be on a side surface of the upper substrate 400. For example, the upper groove portion UH may be formed by being drawn or recessed in a y direction with respect to the upper substrate 400. The upper groove portion UH may be regarded as having a recessed portion formed from the side surface of the upper substrate 400.

The upper groove portion UH may be at an edge where side and lower surfaces of the upper substrate 400 cross or meet each other. For example, a left side surface portion of the upper substrate 400 may be partially removed. The upper substrate 400 may further include a third surface intersecting the side and lower surfaces of the upper substrate 400.

The side surface of the lower substrate 100 and the side surface of the upper substrate 400 may be flush with each other. For example, the side surface of the lower substrate 100 and the side surface of the upper substrate 400 may not be flush with each other.

The pad 600 may be in the upper groove portion UH. The pad 600 may be on the side surface of the upper substrate 400 while being in the upper groove portion UH. The pad 600 may extend to the side surface of the lower substrate 100.

The pad 600 may be adhered to the printed circuit board PCB by an adhesive layer 700. The adhesive layer 700 may include conductive balls, and the pad 600 and the printed circuit board PCB may be electrically connected to each other through the conductive balls.

The pad 600 may include an internal terminal 610 and an external terminal 620.

The internal terminal 610 may be on the inorganic insulating layer IL', and may be connected to the fanout line portion WL by a contact hole. The internal terminal 610 may be on the inorganic insulating layer IL', and one side of the internal terminal 610 may be flush with one side of the lower substrate 100. The internal terminal 610 may be connected to the fanout line portion WL by a contact hole disposed near another side surface of the internal terminal 610.

The sealing member 500 may be on the internal terminal 610. For example, the sealing member 500 may be on the pad 600 to at least partially overlap or face the pad 600.

The external terminal 620 may be on a side surface of each of the upper groove portion UH and the upper substrate 400. The external terminal 620 may be connected to the internal terminal 610. For example, the external terminal 620 may be connected to an upper surface of the internal terminal 610 along a depth d1 at which the upper groove portion UH is disposed on the upper substrate 400.

The external terminal 620 may extend in a thickness direction of the upper substrate 400. For example, the external terminal 620 may extend in a z or −z direction on the side surface of the upper substrate 400. Therefore, the external terminal 620 may be connected to a side surface of the internal terminal 610. In an embodiment, the external terminal 620 may extend to the inorganic insulating layer IL', the buffer layer 111, or the side surface of the lower substrate 100.

A first region R1 may be defined as a region around an edge of the upper groove portion UH, the sealing member 500, and the lower substrate 100. Referring to FIG. 4A, the first region R1 may be a region extending in a thickness direction (e.g., the z or −z direction) of the lower substrate 100 from an edge 100S of the lower substrate 100 corresponding to the upper groove portion UH to the upper groove portion UH.

The external terminal 620 may be disposed in the first region R1, the external terminal 620 may be disposed in the upper groove portion UH and may extend to the first region R1. For example, the external terminal 620 may be disposed in the upper groove portion UH and may extend in the −z direction. Thus, the external terminal 620 may surround or be around at least a portion of the internal terminal 610.

The external terminal 620 and the internal terminal 610, which may form the pad 600 constituting the terminal portion PDA, may include the same material as that of the gate electrode G, the source electrode S, or the drain electrode D of the display area DA.

Referring to FIG. 4C, an x-z planar shape of the groove portion UH may be rectangular, but may not be limited thereto. The upper groove portion UH may have a polygonal shape such as a quadrangle or a pentagon and a shape approximating a semicircle. In a case that the upper groove portion UH may have the shape approximating a semicircle, stress may be relaxed at a vertex portion of the upper substrate 400 forming the upper groove portion UH.

The upper groove portion UH may include a plurality of grooves, and the plurality of grooves may be spaced apart from each other. The upper groove portion UH may be provided with a plurality of grooves spaced apart from each other on the side surface of the upper substrate 400. For example, the upper groove portion UH may include a first groove H1 and a second groove H2. The first groove H1 and the second groove H2 may be spaced apart from each other.

Referring to FIG. 4C, three grooves may be spaced apart from each other in the upper groove portion UH. The upper groove portion UH may have various modifications, such as having three or more grooves.

A plurality of internal terminals 610 may be spaced apart from each other. For example, the internal terminal 610 may include a first internal terminal 611 and a second internal terminal 613. The first internal terminal 611 and the second internal terminal 613 may be spaced apart from each other.

The upper groove portion UH may be disposed to correspond to the at least one internal terminal 610. For example, the first groove H1 of the upper groove portion UH may be disposed to correspond to the first internal terminal 611. In other words, the first internal terminal 611 may be disposed in the first groove H1 of the upper groove portion UH. As another example, the second groove H2 of the upper groove portion UH may be disposed to correspond to the second internal terminal 613. In other words, the second internal terminal 613 may be disposed in the second groove H2 of the upper groove portion UH.

In an embodiment, one side surface of the sealing member 500 between the plurality of internal terminals 610 may be flush with the side surface of the upper substrate 400 or the side surface of the lower substrate 100. In another embodiment, one side surface of the sealing member 500 between the plurality of internal terminals 610 may be flush with the side surface of the upper substrate 400 and the side surface of the lower substrate 100.

A plurality of external terminals 620 may be apart from each other on the upper groove portion UH. For example, a first external terminal 621 may be disposed in the first groove H1, and a second external terminal 623 may be disposed in the second groove H2 so as to be spaced apart from the first external terminal 621. Accordingly, the first external terminal 621 may be connected to the first internal terminal 611, and the second external terminal 623 may be connected to the second internal terminal 613.

The external terminal 620 and the internal terminal 610 may be connected such that a contact area therebetween may be increased according to a side bonding method for attaching the printed circuit board PCB to a side surface of a display panel. Thus, contact resistance may be reduced as a result of the increased contact area.

Since the external terminal 620 may be connected to the internal terminal 610 while being disposed in the upper groove portion UH, a space therein in which the internal terminal 610 and the external terminal 620 may contact each other and a space therein in which the external terminal 620 may enter between the upper substrate 400 and the lower substrate 100 may accommodate a sizing of the aforementioned terminals to thereby ensure reliable operation of the terminal portion PDA.

In another embodiment including the column space 510 (see FIG. 1C), a second region may be defined as region around the upper groove portion UH, the column space 510, and the edge of the lower substrate 100. An external terminal may be disposed in the second region. The second region may be similar to the first region R1.

Figure 5A:
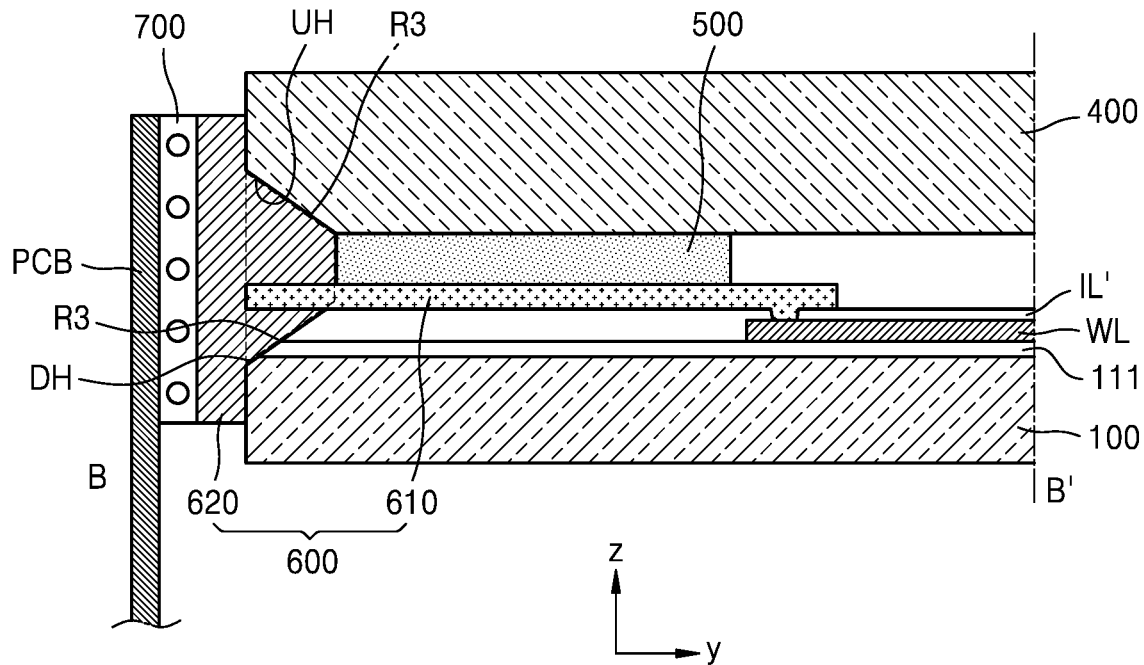
FIG. 5A shows a schematic cross-sectional view of a display apparatus according to another embodiment.
Figure 5B:
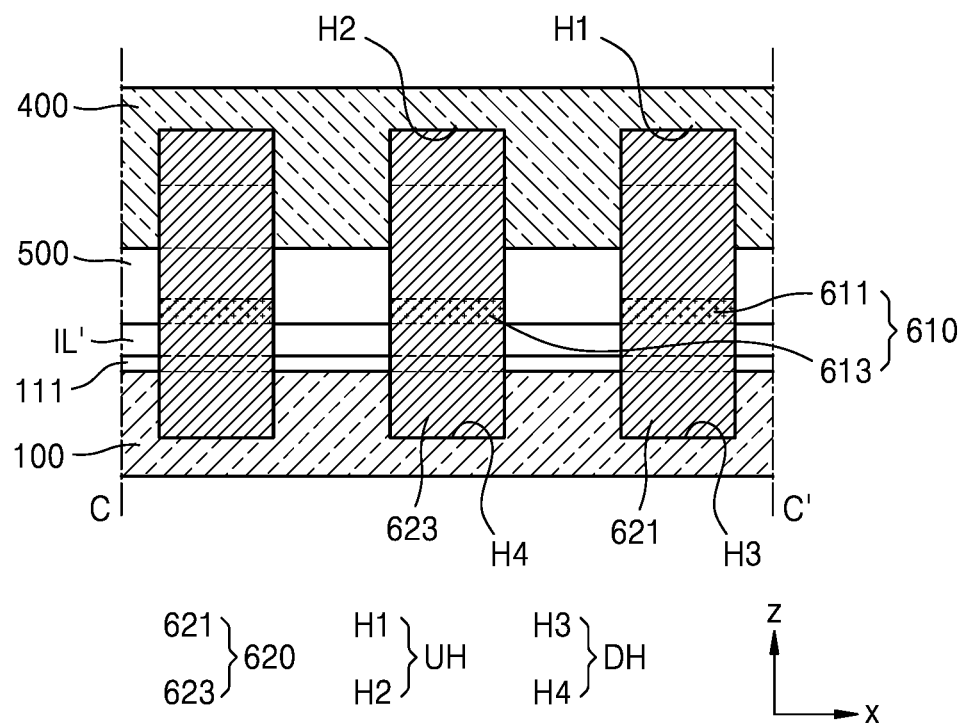
FIG. 5B shows a schematic cross-sectional view of a display apparatus according to another embodiment.

FIGS. 5A and 5B show schematic cross-sectional views of a display apparatus according to another embodiment.

Referring to FIG. 5A, a side surface of the lower substrate 100 of the display apparatus may include a lower groove portion DH.

The lower groove portion DH may be disposed in the y direction with respect to the lower substrate 100. The lower groove portion DH may include a recessed portion disposed on the side surface of the lower substrate 100.

The lower groove portion DH may be disposed at an edge where side and lower surfaces of the lower substrate 100 cross or meet each other. For example, a left end of the lower substrate 100 may be partially removed. The lower substrate 100 may further include a third surface intersecting the side and lower surfaces of the lower substrate 100.

The buffer layer 111 and the inorganic insulating layer IL' may include a buffer layer groove portion and an inorganic insulating layer groove portion, respectively, similarly to the lower groove portion DH. The lower groove portion DH, the buffer layer groove portion, and the inorganic insulating layer groove portion may be connected to each other. Therefore, hereinafter, the lower groove portion DH may be understood as an entire groove portion in which the lower groove portion DH may be connected to the buffer layer groove portion and the inorganic insulating layer groove portion. In other words, the lower groove portion DH may include the buffer layer and inorganic insulating layer groove portions.

The pad 600 may be disposed in the lower groove portion DH. The pad 600 may be integrally formed with the upper groove portion UH and the lower groove portion DH.

A third region R3 may be defined as a region around the upper groove portion UH, the sealing member 500, and the lower groove portion DH. The third region R3 may be a region extending in the thickness direction (e.g., the z or –z direction) of the lower substrate 100 from the lower groove portion DH to the upper groove portion UH.

The external terminal 620 may be disposed in the third region R3, and the external terminal 620 may extend in the thickness direction of the upper substrate 400. Referring to FIG. 5A, the external terminal 620 may extend in the z direction or –z direction and be disposed in the third region R3. The external terminal 620 may extend to the side surfaces of the upper substrate 400 and the lower substrate 100.

The external terminal 620 may be integrally formed with the upper groove portion UH and the lower groove portion DH. The external terminal 620 may be connected to surround or be around at least a portion of the internal terminal 610 in the third region R3. Accordingly, the external terminal 620 may be connected to upper and lower surfaces of the internal terminal 610.

Referring to FIG. 5B, a planar shape of the lower groove portion DH may be rectangular. However, the disclosure may not be limited thereto. The lower groove portion DH may have a polygonal shape such as a quadrangle or a pentagon and a shape approximating a semicircle. In a case that the lower groove portion DH may have the shape approximating a semicircle, stress may be relaxed at a vertex portion of the lower substrate 100 forming the lower groove portion DH.

The lower groove portion DH may include a plurality of grooves, and the plurality of grooves may be spaced apart from each other. The lower groove portion DH may be provided with a plurality of grooves spaced apart from each other on the side surface of the lower substrate 100. For example, a third groove H3 and a fourth groove H4 may be spaced apart from each other.

The lower groove portion DH may be disposed to correspond to the at least one internal terminal 610. For example, the third groove H3 of the lower groove portion DH may be disposed to correspond to the first internal terminal 611. In other words, the first internal terminal 611 may be disposed in the third groove H3 of the lower groove portion DH. As another example, the fourth groove H4 of the lower groove portion DH may be disposed to correspond to the second internal terminal 613. In other words, the second internal terminal 613 may be disposed in the fourth groove H4 of the lower groove portion DH.

The external terminals 620 may be integrally formed with the upper groove portion UH and the lower groove portion DH. For example, the first external terminal 621 may be integrally formed with the first groove H1 and the third groove H3, and the second external terminal 623 may be integrally formed with the second groove H2 and the fourth groove H4.

The external terminal 620 and the internal terminal 610 may be connected such that a contact area therebetween may be increased according to a side bonding method for attaching the printed circuit board PCB to the side surface of the display panel.

The external terminal 620 may be electrically connected to upper and lower surfaces of a conductive layer. Thus, the problem of poor contact with the external terminal 620 may be reduced, and contact resistance may be reduced.

Figure 6:
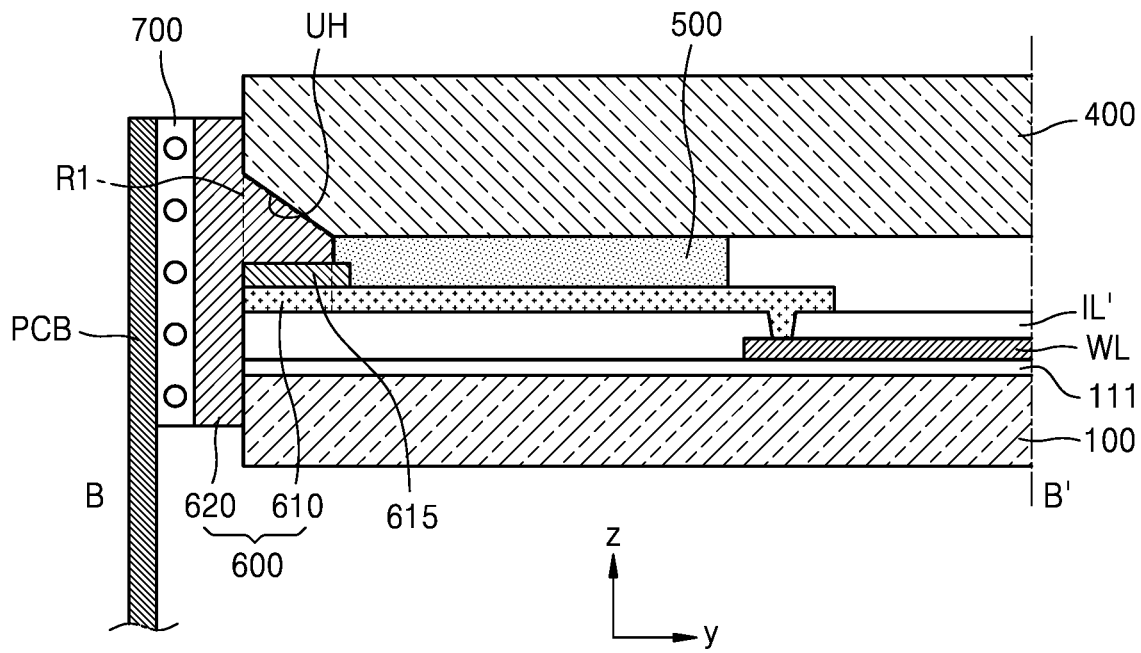
FIG. 6 shows a schematic cross-sectional view of a display apparatus according to another embodiment.

FIG. 6 shows a schematic cross-sectional view of a display apparatus according to another embodiment.

Referring to FIG. 6, the display apparatus may include an additional terminal 615 between the upper substrate 400 and the internal terminal 610.

The additional terminal 615 may be disposed in the first region R1, and the upper groove portion UH may be disposed on the additional terminal 615.

The additional terminal 615 may be connected to the external terminal 620 and the internal terminal 610. Upper and side surfaces of the additional terminal 615 may be connected to the external terminal 620. A lower surface of the additional terminal 615 may be connected to the upper surface of the internal terminal 610. Therefore, the additional terminal 615 may be electrically connected to the external terminal 620 and the internal terminal 610.

The additional terminal 615 may be on the upper surface of the internal terminal 610 to protect the internal terminal 610. As described later below, a laser beam irradiation process may be performed to form the upper groove portion UH in the upper substrate 400. The additional terminal 615 may prevent direct or indirect damage to the internal terminal 610 that may result from laser beam irradiation during the laser beam irradiation process.

FIGS. 7A to 10B show schematic cross-sectional views of a method of manufacturing an embodiment.

Figure 7A:
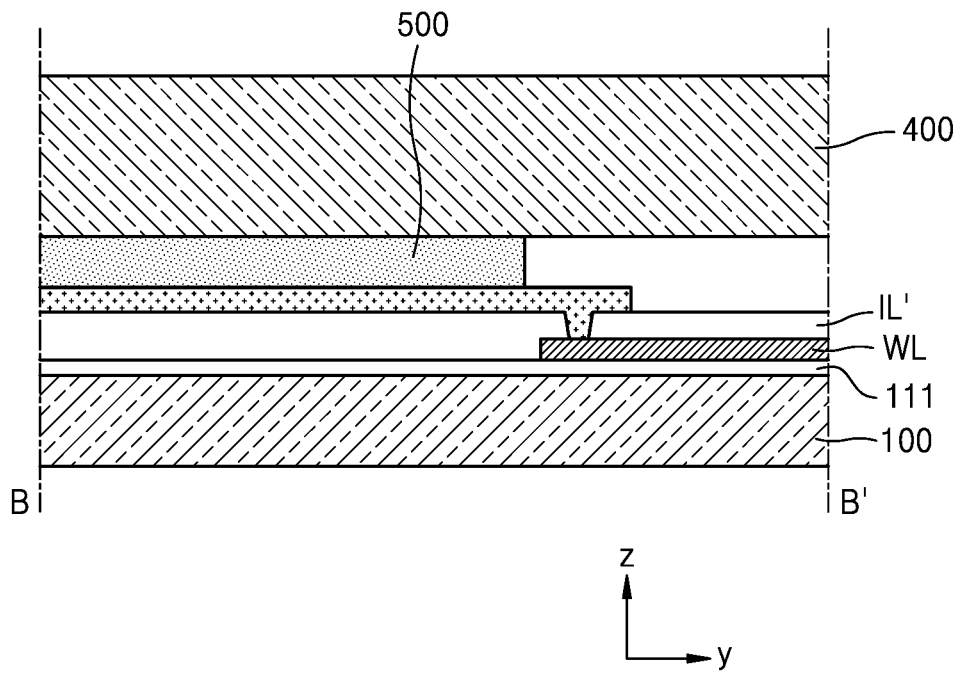
FIGS. 7A to 10B shows schematic cross-sectional views of a method of manufacturing an embodiment.
Figure 7B:
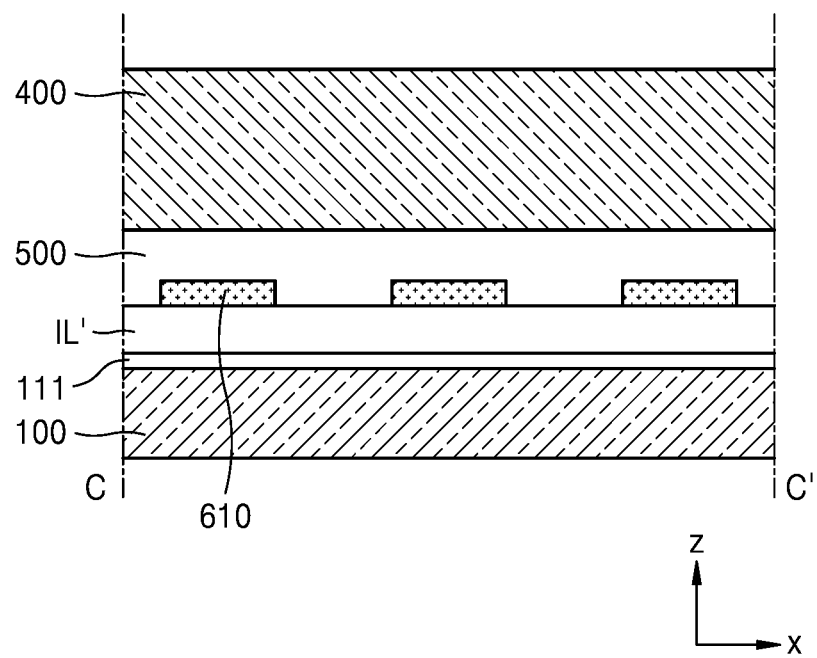

First, referring to FIGS. 7A and 7B, the lower substrate 100 on which the internal terminal 610 may be disposed and the upper substrate 400 may be bonded to the sealing member 500.

The side surface of the internal terminal 610 may be polished. In forming a conductive material 620' (of FIG. 9A), the polishing may increase interfacial adhesion of a conductive material to be deposited on the side surface of the internal terminal 610 by removing foreign substances on the side surface, so that the conductive material may be uniformly deposited on the side surface of the internal terminal 610.

Since the sealing member 500 may be disposed on the internal terminal 610, loosening of the internal terminal 610 may be prevented despite polishing of the side surface of the internal terminal 610.

Figure 8A:
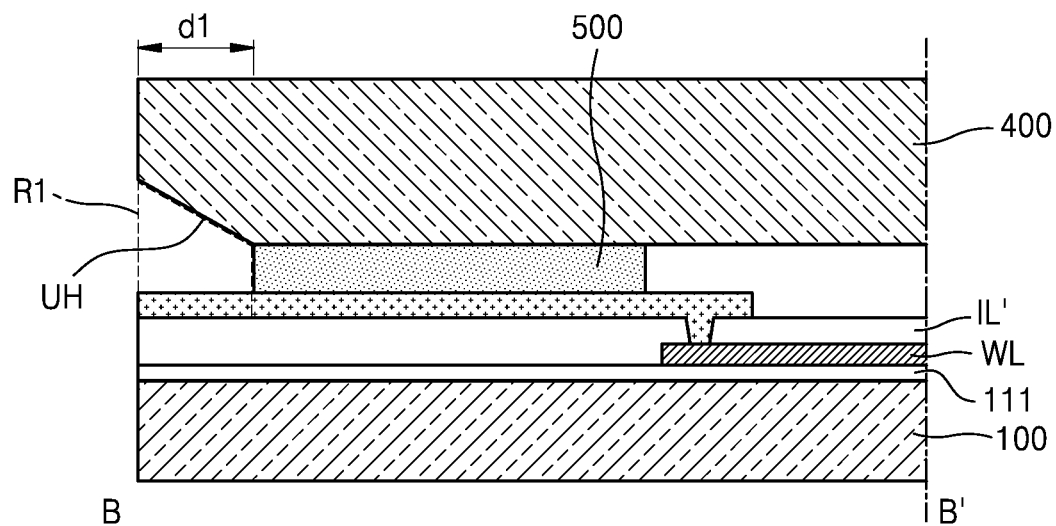
Figure 8B:
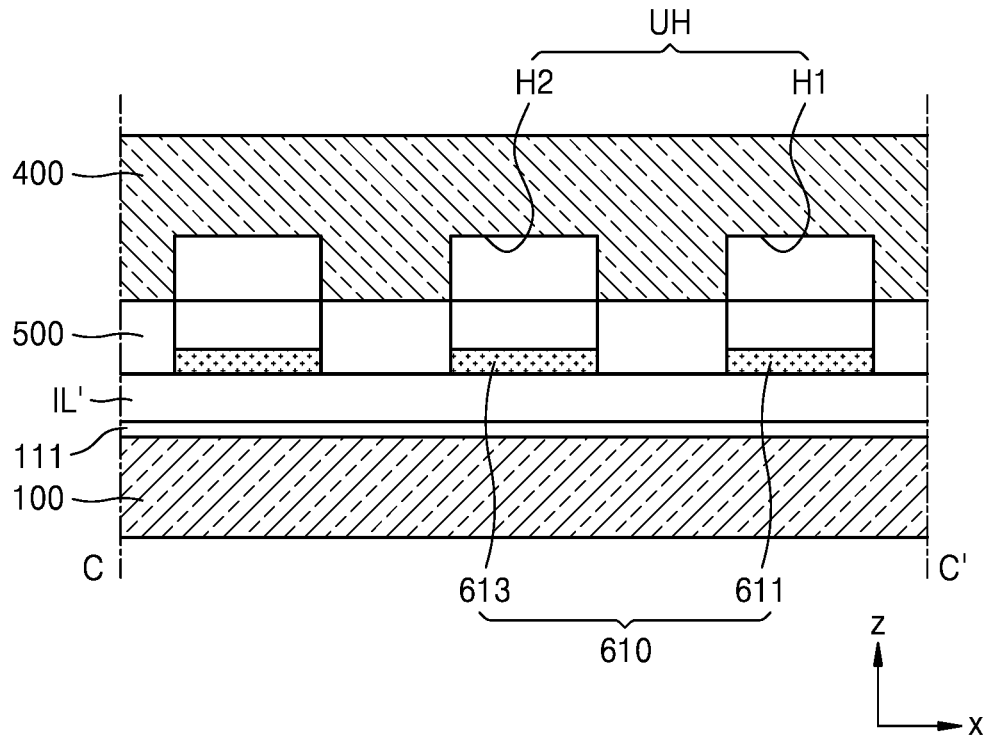

As shown in FIGS. 8A and 8B, some of the upper substrate 400 and the sealing member 500 may be removed, via laser beam irradiation, to expose the upper surface of the internal terminal 610.

The upper groove portion UH may be formed by laser beam irradiation on the side surface of the upper substrate 400. The upper groove portion UH may be formed by irradiating a laser beam at an edge where the side and lower surfaces of the upper substrate 400 cross or meet each other. For example, the upper groove portion UH may be formed by partially removing a left end portion of the upper substrate 400.

A portion of the sealing member 500 under the upper groove portion UH may also be removed via laser beam irradiation. However, the disclosure may not be limited thereto. In a case that the sealing member 500 may include an organic material, some of the sealing member 500 may be removed by heat generated in a case that the upper groove UH may be formed by laser beam irradiation.

Thus, the upper groove portion UH may be disposed on the upper surface as well as the side surface of the internal terminal 610.

Referring to FIG. 8B, the upper groove portion UH may be formed in a rectangular shape, but may not be limited thereto. The upper groove portion UH may have a polygonal shape such as a quadrangle or a pentagon and a shape approximating a semicircle, according to laser beam irradiation.

The upper groove UH may be provided with a plurality of grooves spaced apart from each other on the side surface of the upper substrate 400. For example, the upper groove portion UH may include the first groove H1 and the second groove H2. The second groove H2 may be formed on the side surface of the upper substrate 400 so as to be spaced apart from the first groove H1 and the first groove H1.

Although an embodiment may include three grooves that may be spaced apart from each other in the upper groove portion UH, the upper groove portion UH may have various modifications, such as having three or more grooves, via irradiating of a laser beam.

The upper groove portion UH may be formed by irradiating a laser beam so as to correspond to at least one internal terminal 610. For example, the first groove H1 of the upper groove portion UH may be formed to correspond to the first internal terminal 611. In other words, the first internal terminal 611 may be disposed in the first groove H1 of the upper groove portion UH. As another example, the second groove H2 of the upper groove portion UH may be formed to correspond to the second internal terminal 613. In other words, the second internal terminal 613 may be disposed in the second groove H2 of the upper groove portion UH.

Figure 9A:
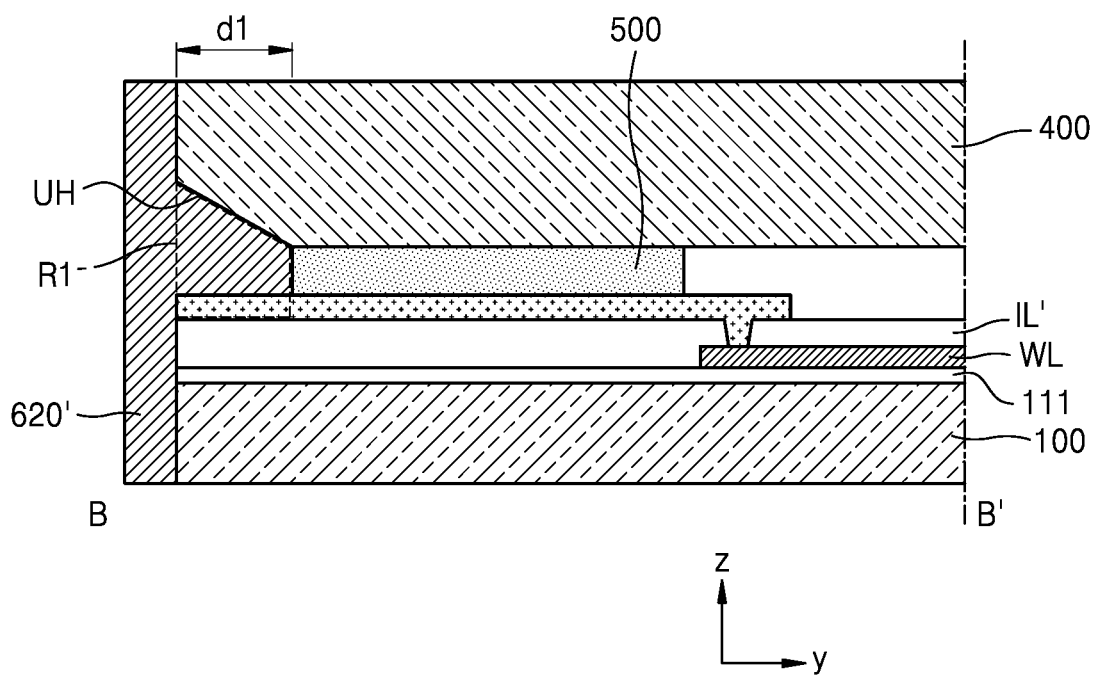
Figure 9B:
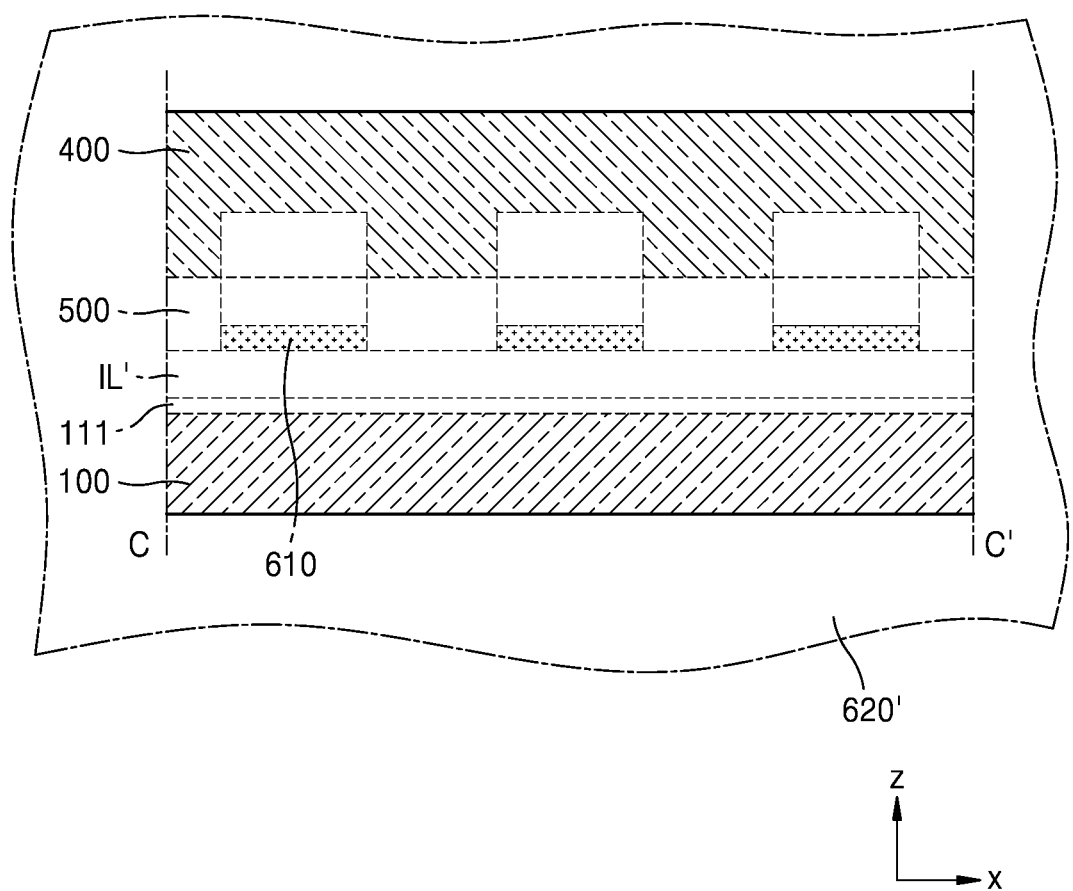

Referring to FIGS. 9A and 9B, the conductive material 620' may be formed on the side surfaces of the upper substrate 400 and the lower substrate 100 using a spin coating process, a printing process, a sputtering process, a chemical vapor deposition (CVD) process, an atomic layer deposition (ALD) process, a plasma enhanced CVD (PECVD) process, a high density plasma-CVD (HDP-CVD) process, a vacuum deposition process, or the like. However, for convenience of description, a process of forming the conductive material 620' on the side surfaces of the upper substrate 400 and the lower substrate 100 may include the sputtering process.

The conductive material 620' may be integrally formed with the side surfaces of the upper substrate 400 and the lower substrate 100. The conductive material 620' may extend into the first region R1 and be connected to the internal terminal 610. The conductive material 620' may be connected to the side and upper surfaces of the internal terminal 610.

The conductive material 620' may be formed to extend in a longitudinal direction of the upper substrate 400 (e.g., a y or −y direction), and may be formed in the thickness direction of the upper substrate 400 (e.g., z or −z direction) on the side surface of the upper substrate 400. The conductive material 620' may be formed on the side surface of the lower substrate 100 to extend in the thickness direction of the upper substrate 400.

The depth at which the conductive material 620' may be disposed on the upper substrate 400 may be the same as the depth dl at which the upper groove UH may be disposed on the upper substrate 400. Since the upper groove portion UH may be disposed on the upper substrate 400, the conductive material 620' may be sufficiently formed in the first region R1.

Figure 10A:
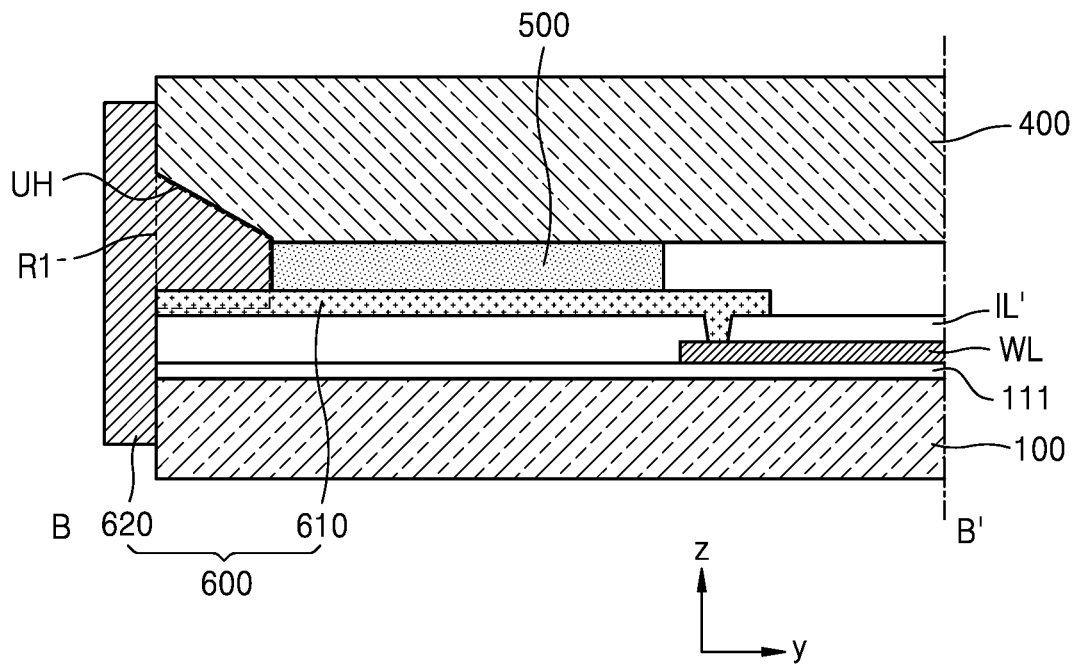
Figure 10B:
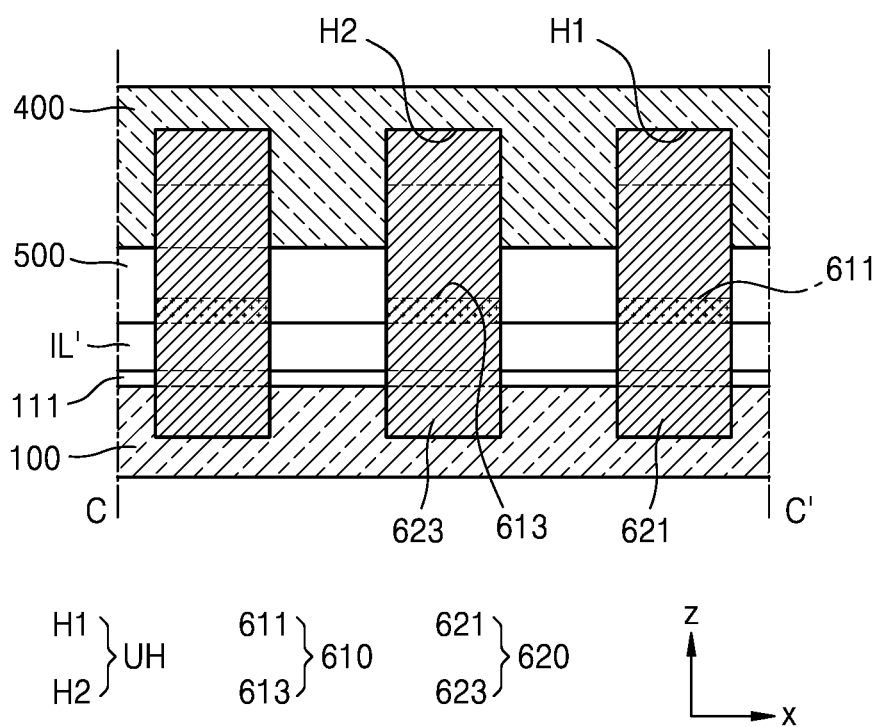

Referring to FIGS. 10A and 10B, the external terminals 620 may be formed by irradiating a laser beam onto the conductive material 620'. The external terminals 620 may be spaced apart from each other on the upper groove portion UH. For example, the first external terminal 621 may be disposed in the first groove H1, and the second external terminal 623 may be disposed in the second groove H2 so as to be spaced apart from the first external terminal 621.

The external terminals 620 may be formed to have a same width as the internal terminal 610, respectively. However, the disclosure may not be limited thereto, and the width of the external terminal 620 may be greater than the width of the internal terminal 610.

The external terminal 620 may be formed on one side of the first region R1 and the internal terminal 610. Thus, the external terminal 620 may be sufficiently connected to the upper surface of the internal terminal 610.

In examples other than those provided by the embodiments herein, such as the comparative examples discussed below, the side surface of the internal terminal 610 may be sized to be less than the upper surface of the internal terminal 610. For example, a thickness of the internal terminal 610 may be less than a length of the internal terminal 610. Accordingly, in a case that the external terminal 620 may be formed only on the side surface of the internal terminal 610, the contact resistance may be caused to increase. Before the external terminal 620 may be formed, a grinding operation may be performed on the side surface of the internal terminal 610. Due to the grinding operation, the side surface of the internal terminal 610 may be disposed in the lower substrate 100 or the upper substrate 400. Accordingly, poor contact between the external terminal 620 and the internal terminal 610 may occur.

Figure 11A:
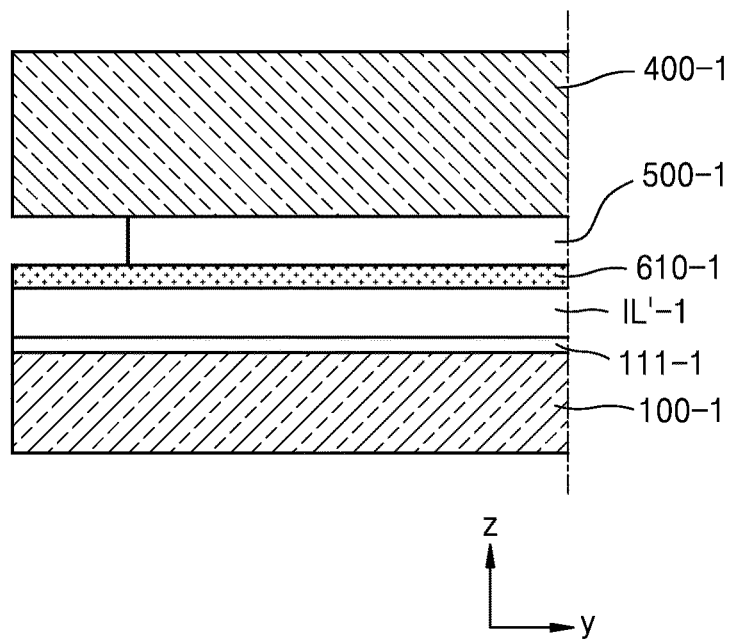
FIGS. 11A and 11B shows views of comparative examples for comparison with an embodiment.
Figure 11B:
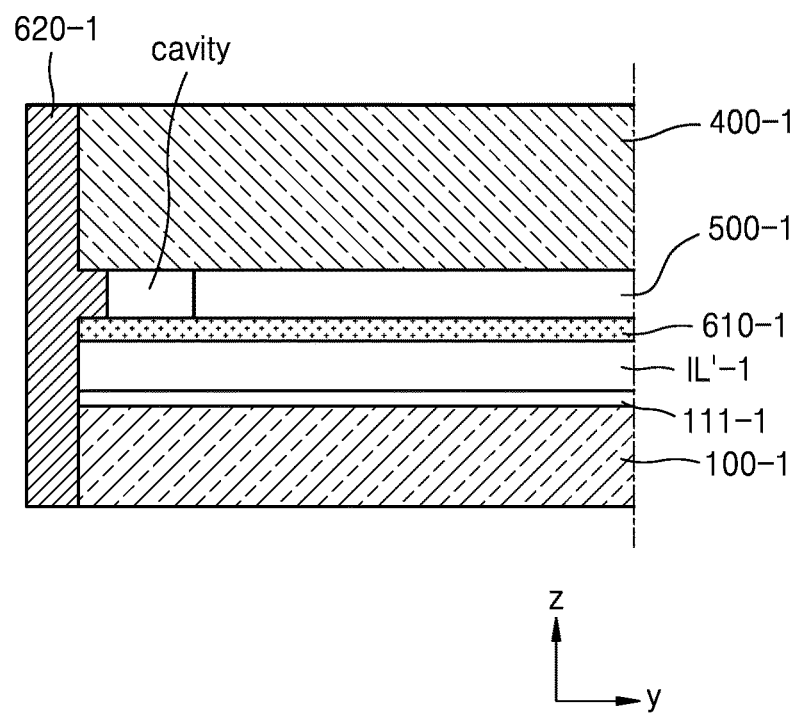

As shown in FIGS. 11A and 11B, even in a comparative example in which the upper groove portion UH is not disposed on the upper substrate 400, a conductive material 620-1 may be formed between an upper substrate 400-1 and a lower substrate 100-1 by a sputtering process. However, in the comparative example, the conductive material 620-1 may not be sufficiently applied between the upper substrate 400-1 and the lower substrate 100-1, and a cavity may be formed. This cavity may result since a sufficient vacuum is not maintained between the upper substrate 400-1 and the lower substrate 100-1, and thus the conductive material 620-1 is not deposited to a sealing member 500-1.

Therefore, an area where the upper surface of an internal terminal 610-1 and the conductive material 620-1 are connected to each other may be insufficient for desired electrical conductivity. As a result, contact resistance and insufficient electrical contact may increase.

In order to minimize this phenomenon, embodiments herein provide that the upper groove portion UH may be provided on the side surface of the upper substrate 400, and the external terminal 620 may be formed in the upper groove portion UH. In a case that the conductive material 620' may be formed by the sputtering process, the conductive material 620' may be sufficiently coated on the upper surface of the internal terminal 610, thereby reducing opportunity for each of poor electrical contact and increased contact resistance. Therefore, reliability of a display apparatus implementing an embodiments or embodiments herein, may be improved.

As described above, embodiments employ a side bonding method for attaching a printed circuit board to side surfaces of an upper substrate and a lower substrate, and thus a non-display area outside of a display area may be minimized.

In the side bonding method according to the embodiments, since a contact area between metals increases, contact resistance between the metals may be reduced. Therefore, the reliability of a display apparatus may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus, comprising:
   a lower substrate comprising a display area comprising a display element and a non-display area around the display area;
   a sealing member disposed on the non-display area and around the display area;
   a terminal portion disposed on the non-display area and comprising at least one internal terminal extending toward an edge of the lower substrate;
   a fanout line portion connected to the at least one internal terminal and comprising a line extending to the display area;
   an upper substrate disposed to face the lower substrate and bonded to the lower substrate by the sealing member; and
   an upper groove portion on a side surface of the upper substrate to expose the at least one internal terminal.

2. The display apparatus of claim 1,
   wherein an external terminal is disposed in a first region defined by the upper groove portion, the sealing member, and the edge of the lower substrate.

3. The display apparatus of claim 2,
   wherein the external terminal is disposed around a portion of the at least one internal terminal.

4. The display apparatus of claim 3,
   wherein the external terminal is connected to side and upper surfaces of the at least one internal terminal.

5. The display apparatus of claim 2,
   wherein the external terminal extends on the side surface of the upper substrate in a thickness direction of the upper substrate and is disposed on a side surface of the lower substrate.

6. The display apparatus of claim 2,
   wherein the at least one internal terminal comprises a first internal terminal and a second internal terminal, and
   the upper groove portion comprises a first groove and a second groove spaced apart from the first groove,
   wherein the first internal terminal is disposed in the first groove, and
   the second internal terminal is disposed in the second groove.

7. The display apparatus of claim 6,
   wherein the external terminal comprises a first external terminal and a second external terminal spaced apart from the first external terminal,
   wherein the first external terminal is disposed in the first groove and connected to the first internal terminal, and
   the second external terminal is disposed in the second groove and connected to the second internal terminal.

8. The display apparatus of claim 1, further comprising:
   a column support disposed between the terminal portion and the sealing member, and
   the external terminal is disposed in a second region defined by the upper groove portion, the column support, and the edge of the lower substrate.

9. The display apparatus of claim 1, further comprising:
   a lower groove portion on a side surface of the lower substrate to correspond to the at least one internal terminal,
   wherein the at least one terminal is disposed in the lower groove portion.

10. The display apparatus of claim 9,
    wherein an external terminal is disposed in a third region defined by the upper groove portion, the lower groove portion, and the sealing member, and
    the external terminal is connected to the at least one internal terminal.

11. The display apparatus of claim 1, further comprising:
    an additional terminal between the upper substrate and the at least one internal terminal,
    wherein the additional terminal is disposed in a first region defined by the upper groove portion, the sealing member, and the edge of the lower substrate.

12. The display apparatus of claim 11,
    wherein an external terminal is disposed in the first region, and
    the external terminal is connected to the additional terminal.

13. The display apparatus of claim 1,
    wherein the side surface of the upper substrate and a side surface of the lower substrate are flush with each other.

14. A display apparatus, comprising:
    a lower substrate comprising a display area comprising a display element and a non-display area surrounding the display area;
    a sealing member disposed on the non-display area and surrounding the display area;
    a terminal portion disposed on the non-display area and comprising at least one internal terminal extending to an edge of the lower substrate;
    a fanout line portion connected to the at least one internal terminal and comprising a line extending to the display area;
    an upper substrate disposed to face the lower substrate and bonded to the lower substrate by the sealing member;
    an upper groove portion disposed at an edge where side and lower surfaces of the upper substrate meet; and
    an external terminal disposed in the upper groove portion,
    wherein the upper groove portion corresponds to the at least one internal terminal, and
    the external terminal extends toward and is connected to the at least one internal terminal,
    wherein the at least one internal terminal is disposed in the upper groove portion and is connected to the external terminal in the upper groove portion.

15. The display apparatus of claim 14,
wherein the external terminal is connected to an upper surface of the at least one internal terminal.

16. The display apparatus of claim 14,
wherein the external terminal extends in a thickness direction of the upper substrate and is disposed on a side surface of the lower substrate.

17. The display apparatus of claim 14, further comprising:
a lower groove portion disposed at an edge where side and upper surfaces of the lower substrate meet,
wherein the external terminal extends in the thickness direction of the upper substrate and is disposed in the lower groove portion, and is disposed around the at least one internal terminal.

18. The display apparatus of claim 17,
wherein the external terminal is connected to a lower surface of the at least one internal terminal.

19. The display apparatus of claim 14, further comprising:
an additional terminal between the upper substrate and the at least one internal terminal, and
the external terminal is connected to the additional terminal.

20. The display apparatus of claim 14,
wherein the side surface of the upper substrate and a side surface of the lower substrate are flush with each other.

* * * * *